(12) United States Patent
Liu et al.

(10) Patent No.: US 12,049,987 B2
(45) Date of Patent: Jul. 30, 2024

(54) LED BASE MODULE, LED MODULE, AND LED LIGHTING STRIP

(71) Applicant: DONGGUAN OPSCO OPTOELECTRONICS CO., LTD., Dongguan (CN)

(72) Inventors: Mingjian Liu, Dongguan (CN); Gengsheng Zhu, Dongguan (CN); Zhenlei Wu, Dongguan (CN); Kai Zhou, Dongguan (CN)

(73) Assignee: DONGGUAN OPSCO OPTOELECTRONICS CO., LTD., Dongguan (CN)

( * ) Notice: Subject to any disclaimer, the term of this patent is extended or adjusted under 35 U.S.C. 154(b) by 0 days.

(21) Appl. No.: 18/119,288

(22) Filed: Mar. 9, 2023

(65) Prior Publication Data

US 2023/0220960 A1    Jul. 13, 2023

Related U.S. Application Data

(63) Continuation of application No. PCT/CN2022/073284, filed on Jan. 21, 2022.

(30) Foreign Application Priority Data

Dec. 7, 2021  (CN) .......................... 202111487118.8

(51) Int. Cl.
  *F21S 4/24*    (2016.01)
  *F21V 19/00*   (2006.01)
  *F21Y 115/10*  (2016.01)

(52) U.S. Cl.
  CPC ............ *F21S 4/24* (2016.01); *F21V 19/0025* (2013.01); *F21Y 2115/10* (2016.08)

(58) Field of Classification Search
  CPC ...... F21S 4/00–24; F21V 19/001–0035; F21Y 2103/10; F21Y 2115/10; H01L 25/0753; H01L 33/48–62
  See application file for complete search history.

(56) References Cited

FOREIGN PATENT DOCUMENTS

| CN | 209000909 U | 6/2019 |
|----|-------------|--------|
| CN | 111092071 A | 5/2020 |
| CN | 114352956 A | 4/2022 |
| CN | 216307489 U | 4/2022 |

OTHER PUBLICATIONS

International Search Report of PCT Patent Application No. PCT/CN2022/073284 issued on May 27, 2022.

*Primary Examiner* — Jason M Han
(74) *Attorney, Agent, or Firm* — Andrew C. Cheng

(57) ABSTRACT

An LED base module includes an LED lighting base and a supporting base. The LED lighting base includes an insulation housing and multiple conductive terminals fixed in the insulation housing. Each of the conductive terminals includes a chip fixing portion electrically connected to the chip assembly and a pin portion exposed outside the insulation housing. The supporting base includes multiple conductive portions and one or more avoidance through-holes. Each of the conductive portions includes a first terminal portion and a second terminal portion which are respectively exposed at two opposite surfaces of the supporting base. The first terminal portion is electrically connected to the pin portion, and the second terminal portion is electrically connected to a conductive line. The avoidance through-hole is provided for avoidance of stamp-cutting of one of the conductive lines.

16 Claims, 11 Drawing Sheets

LED BASE MODULE, LED MODULE, AND LED LIGHTING STRIP

FIELD OF THE INVENTION

The present invention relates to the field of light-emitting diode (LED) technology, and more particularly to an LED base module, an LED module, and an LED lighting strip.

DESCRIPTION OF THE RELATED ART

A main-stream way of processing for an LED lighting strip that is currently available in the market is to apply encapsulation resin to encapsulate an LED and a driving chip in a mounting trough formed in an LED frame to make an LED lighting bead and then apply a power line and a signal line to serially connect multiple LED lighting beads to make an LED light strip. However, in such manufacturing process of the LED lighting strip, due to being limited by the structure of the LED frame and the pin distance, the power line and the signal line are directly soldered to the pins, and then a portion of the signal line that is located between the pins is cut off to form a signal input line and a signal transmission line. However, pseudo soldering or insecure soldering may easily occur in soldering the power line and the signal line, and further, cutting off the signal line may easily cause problems of pin deformation, leading to high failure rate and low reliability of the lighting strip, and also a risk of easy failure in the life span thereof.

SUMMARY OF THE INVENTION

The purpose of an embodiment of the application is to provide an LED base module, aiming to improving the pass rate for processing LED lighting strips and the reliability of the LED lighting strips.

A first objective of the application provides a technical solution as follows:

An LED base module comprises:
   an LED lighting base, the LED lighting base comprising an insulation housing and multiple conductive terminals;
   each of the conductive terminals being fixed in the insulation housing, each of the conductive terminals comprising a chip fixing portion electrically connectable with an LED) chip assembly and a pin portion exposed outside the insulation housing;
   a supporting base, which supports and carries the LED lighting base, wherein the supporting base comprises multiple conductive portions and at least one avoidance through-hole; each of the conductive portions comprises a first terminal portion and a second terminal portion, the first terminal portion and the second terminal portion being respectively exposed at two opposite surfaces of the supporting base, the first terminal portion being electrically connectable with the pin portion, the second terminal portion being electrically connectable with a conductive line; the at least one avoidance through-hole is arranged to receive one of the conductive lines to span thereover in order to achieve avoidance for stamp-cutting.

In one embodiment, the insulation housing comprises a bottom end surface and a top end surface, and the pin portion is exposed outside the bottom end surface; the conductive portions are arranged on the supporting base as being extended in a direction from the bottom end surface toward the top end surface, the first terminal portion facing toward the bottom end surface, the second terminal portion facing away from the bottom end surface; the avoidance through-hole is formed in the supporting base in a direction from the bottom end surface toward the top end surface.

In one embodiment, at least a portion of the conductive portions are grouped pairwise to form first conductive pairs, one of the conductive portions of the first conductive pair being an input terminal, another one of the conductive portions being an output terminal; the avoidance through-hole is formed between the two conductive portions of one pair of the first conductive pair.

In one embodiment, the number of the first conductive pair is one, and the input terminal of the first conductive pair is a first signal input terminal and the output terminal is a first signal output terminal; the number of the avoidance through-hole is one, and the avoidance through-hole is arranged between the first signal input terminal and the first signal output terminal;

or alternatively, the number of the first conductive pair is one, and the input terminal of the first conductive pair is a first signal input terminal and the output terminal is a first signal output terminal; the number of the avoidance through-holes is two or more, and one of the avoidance through-holes is arranged between the first signal input terminal and the first signal output terminal;

or alternatively, the number of the first conductive pairs is two or more, and the input terminal of one pair of the first conductive pairs is a first signal input terminal and the output terminal is a first signal output terminal; the number of the avoidance through-holes is two or more, and each of the avoidance through-holes is correspondingly formed between the two conductive portions of one pair of the first conductive pairs.

In one embodiment, an orthographic projection that the bottom end surface of the LED lighting base casts on the supporting base does not exceed an area circumferentially delimited by an outer edge of the supporting base.

In one embodiment, the orthographic projection that the bottom end surface of the LED lighting base casts on the supporting base falls within the area circumferentially delimited by the outer edge of the supporting base;

or alternatively, the orthographic projection that the bottom end surface of the LED lighting base casts on the supporting base coincides the area circumferentially delimited by the outer edge of the supporting base.

In one embodiment, the conductive terminals are fixed in the insulation housing by means of injection molding, the insulation housing comprising a bottom end surface and a top end surface, the insulation housing comprising a recessed compartment, the recessed compartment being recessed in direction from the top end surface toward the bottom end surface to receive an LED chip assembly and an LED encapsulation resin therein; all of the chip fixing portions extend from the insulation housing into an interior of the recessed compartment;

or alternatively, the conductive terminals are fixed in the insulation housing by means of compression molding, the insulation housing comprising a bottom end surface and a top end surface, the chip fixing portion being exposed outside the top end surface, the pin portion being exposed outside the bottom end surface, the top end surface being applicable to compression-molded encapsulation with the LED encapsulation resin.

Compared to the prior art, the LED base module provided in the embodiment of the application comprises an LED lighting base and a supporting base carrying the LED lighting base, and the LED lighting base comprises an insulation housing and multiple conductive terminals, and each of the conductive terminals comprises a chip fixing portion electrically connectable with the LED chip assembly and a pin portion exposed outside the insulation housing; the supporting base comprises multiple conductive portions corresponding to the pin portions and at least one avoidance through-hole; the conductive portions are electrically connectable with the conductive lines and the pin portions, and the avoidance through-hole is provided for simplifying stamp-cutting of the conductive line. In such a structural design, by including the supporting base, it is possible to conduct soldering and stamp-cutting of the conductive lines on the supporting base and problems of pseudo soldering, insecure soldering, and pin deformation resulting from soldering and stamp-cutting of conductive lines conducted on the LED lighting base are resolved, so as to advantageous for increasing the processing efficiency and pass rate of processing for the LED lighting strips and improving the reliability of the LED lighting strips for made, and further, also reducing the processing precision for the LED lighting strips.

A second objective of the application is to provide an LED module, of which a specific technical solution is as follows:

An LED module comprises:

the supporting base described above, one of the conductive portions of the supporting base being a first signal input terminal, and another one of the conductive portions being a first signal output terminal, one avoidance through-hole being arranged between the first signal input terminal and the first signal output terminal;

an LED bead, the LE) bead comprising an LED chip assembly, an LED encapsulation resin, and the LED lighting base described above;

the LED chip assembly being electrically connected to the chip fixing portions;

the LED encapsulation resin encapsulating the LED chip assembly and the chip fixing portions;

one of the pin portions being a second signal input end, another one of the pin portions being a second signal output end; the second signal input end corresponding to and connected to the first signal input terminal, the second signal output end corresponding to and connected to the first signal output terminal.

In one embodiment, the LED chip assembly comprises a driving chip and at least one kind of light-emitting chip, the driving chip being electrically connected to the light-emitting chip.

Compared to the prior art, the LED module provided in the embodiment of the application comprises an LED bead and a supporting base. Since the LED bead includes a supporting base that has an avoidance through-hole, it is possible to avoid conducting soldering and stamp-cutting directly on the LED bead, and instead, the soldering and stamp-cutting of the conductive lines are carried out on the supporting base, and problems of pseudo soldering, insecure soldering, and pin deformation resulting from soldering and stamp-cutting of conductive lines conducted on the LED lighting base are resolved, so as to advantageous for increasing the pass rate and reliability of processing for the LED lighting strips.

A third objective of the application is to provide an LED lighting strip, of which a specific technical solution is as follows:

An LED lighting strip comprises:
at least two such LEI) modules described above; each of the LED beads corresponding to and soldered to one of the supporting bases;
a conductive line assembly, the conductive line assembly at least comprising a power line, a signal input line, and at least one signal transmission line;
wherein one end of the signal input line is connected to an external signal source and an opposite end is connected to the first signal input terminal of one of the supporting bases in order to input a signal into the LED lighting strip; one end of the signal transmission line is connected to the first signal output terminal of one of the supporting bases and an opposite end is connected to the first signal input terminal of an adjacent one of the supporting bases so as to realize cascade transmission of the signal between the two adjacent LED beads;
the power line electrically connecting the LED beads to an external power source.

In one embodiment, the power line is connected to a remaining one of the conductive portions of the supporting bases, in order to supply electricity to the LED lighting strip; and/or, the LED lighting strip further comprises insulative sealing resin, the insulative sealing resin at least enclosing connecting portions where the LED modules and the conductive line assembly are connected to each other.

In one embodiment, the LED lighting strip further comprises a light casing corresponding to and matching the LED modules, and the light casing comprises a receiving chamber, each of the LED modules being received in the receiving chamber, the conductive line assembly extending out of the light casing from the receiving chamber.

The beneficial efficacy of the application is that, as compared to the prior art, the LED lighting strip provided in the application is such that the processing operation is to conduct soldering and stamp-cutting of the conductive lines on the supporting base, so as to resolve the problems of pseudo soldering, insecure soldering, and pin deformation resulting from soldering and stamp-cutting of conductive lines conducted on the LED lighting base, and thus, the reliability of the LED lighting strip can be effectively enhanced, and the quality of the LED lighting strip improved.

BRIEF DESCRIPTION OF THE DRAWINGS

To more clearly expound the technical solution of embodiments of the application, a brief description will be provided below for the drawings that are necessary for illustrating the embodiments. Obviously, the drawings described below are provided for some of the embodiments of the application, and based on such drawings, those having ordinary skill in the art may envisage other drawings without creative endeavor.

Reference signs of the drawings:

- 10: LED base module;
- 11: LED lighting base; 111: insulation housing; 110: recessed compartment; 112: conductive terminal; 1121: chip fixing portion; 1122: pin portion; 11221: second signal input end; 11222: second signal output end; 1101: top end surface; 1102: bottom end surface;
- 12: supporting base; 120: avoidance through-hole; 121: conductive portion; 1201: first terminal portion; 1202: second terminal portion; 1211: first signal input terminal; 1212: first signal output terminal;
- 20: LED module;
- 21: LED bead: 211: LED chip assembly; 2111: driving chip; 2112: light-emitting chip; 2113: connecting line; 212: LED encapsulation resin;
- 30: LED lighting strip;
- 31: conductive line assembly; 310: line core exposed portion; 311: power line: 312: signal input line; 313: signal transmission line; 314: grounding line;
- 32: light casing; 320: receiving chamber; 3201: resin injection aperture; 3202: conductive line aperture; 321: first casing member, 322: second casing member;
- 40: stamp-cutting apparatus; 41: cutter: PQ: first linear trace: RS: second linear trace.

DETAILED DESCRIPTION OF EMBODIMENTS

A clear and complete description of the technical solution provided in embodiments of the application is provided below with reference to the drawings of the embodiments of the application. Of course, the described embodiments are just some of the embodiments of the application, and are not all the embodiments thereof. Based on the embodiments of the application, those having ordinary skill in the art may, without paying creative endeavor, contemplate all the remaining embodiments, which all belong to the scope of protection of the application.

Figure 9:
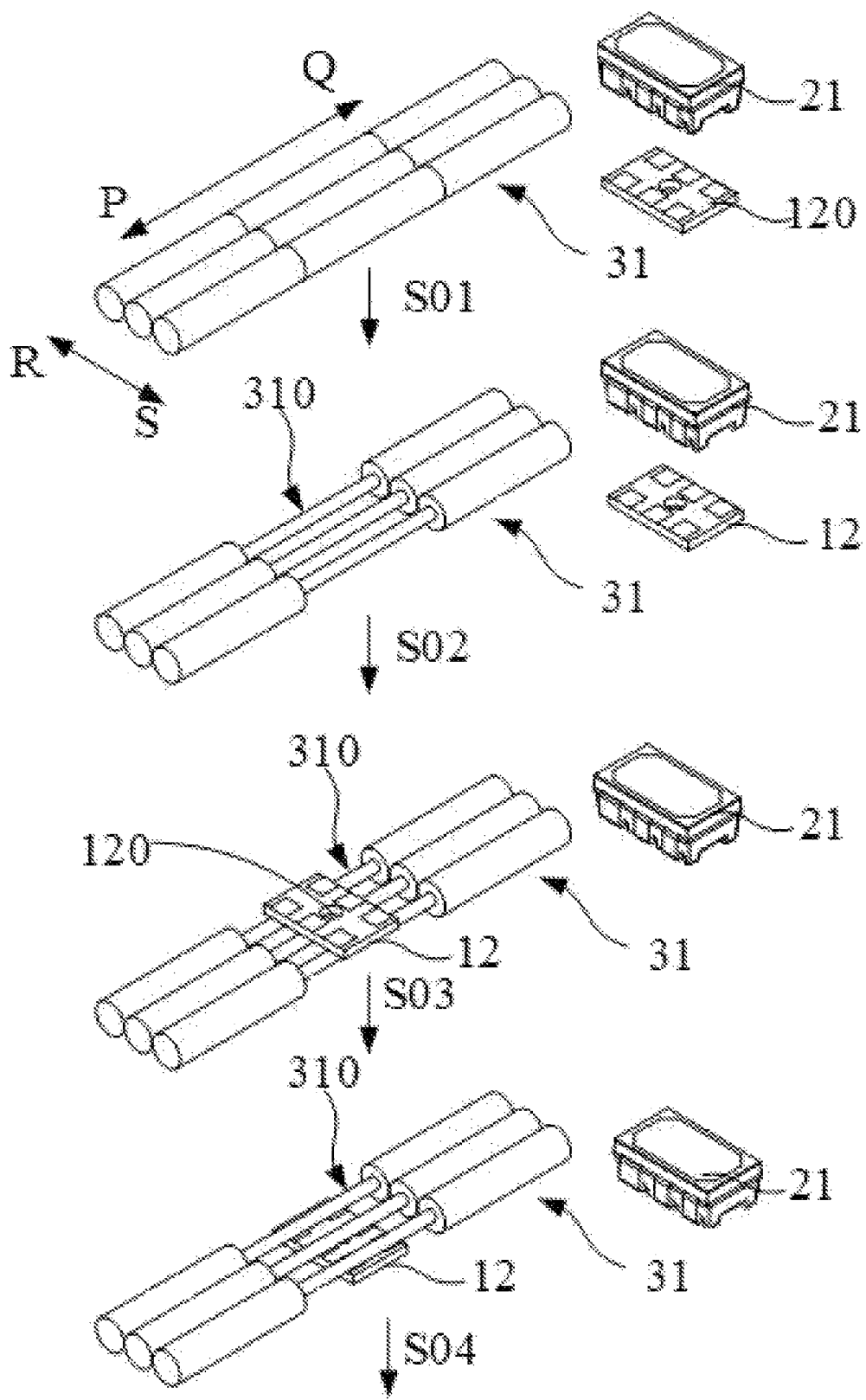
FIG. 9 is a schematic view illustrating a flow of a manufacturing method for the LED lighting strip in EMBODIMENT 1 of the application.
Figure 10:
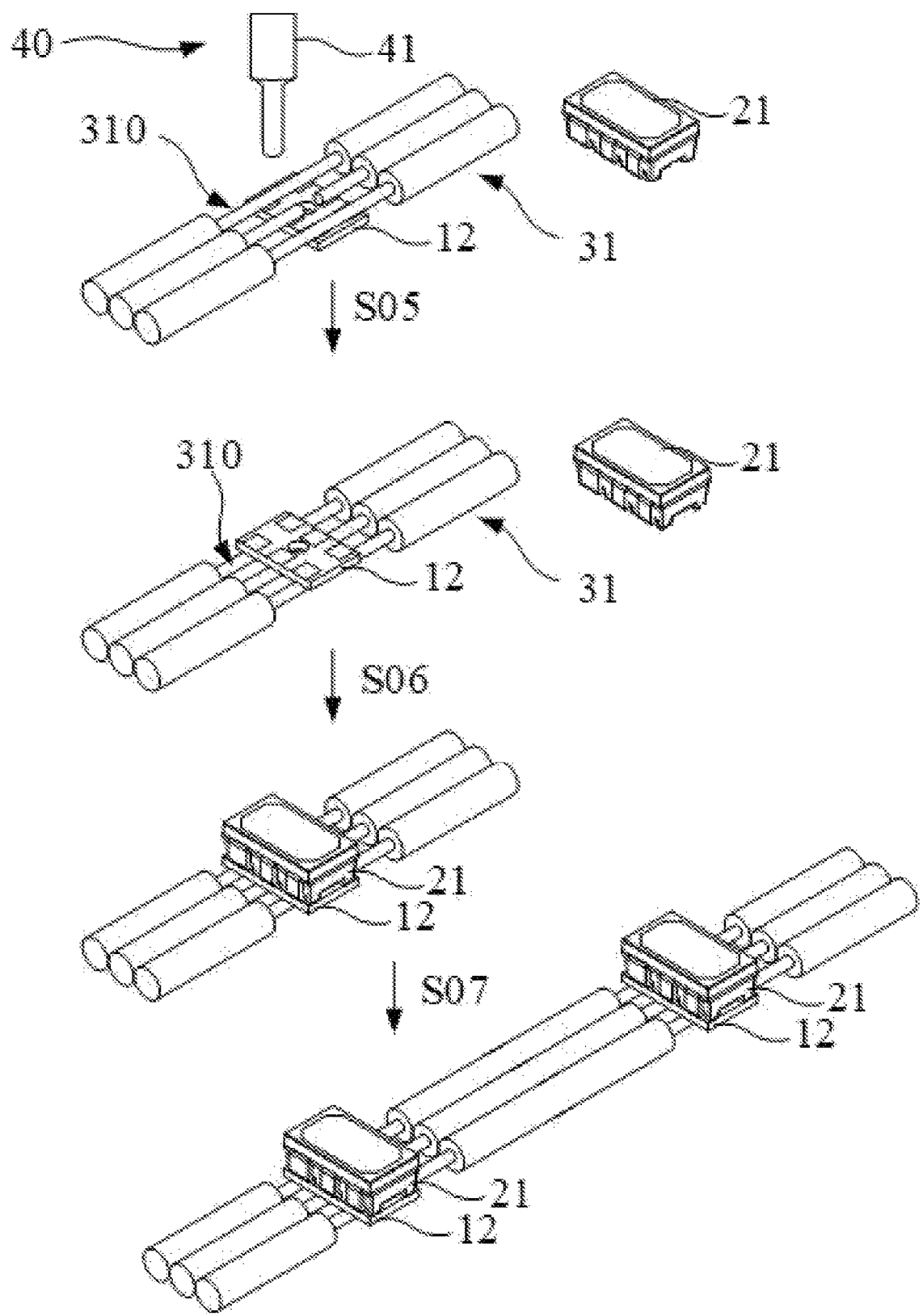
FIG. 10 is a schematic view illustrating a flow of a manufacturing method for the LED lighting strip in EMBODIMENT 1 of the application.
Figure 11:
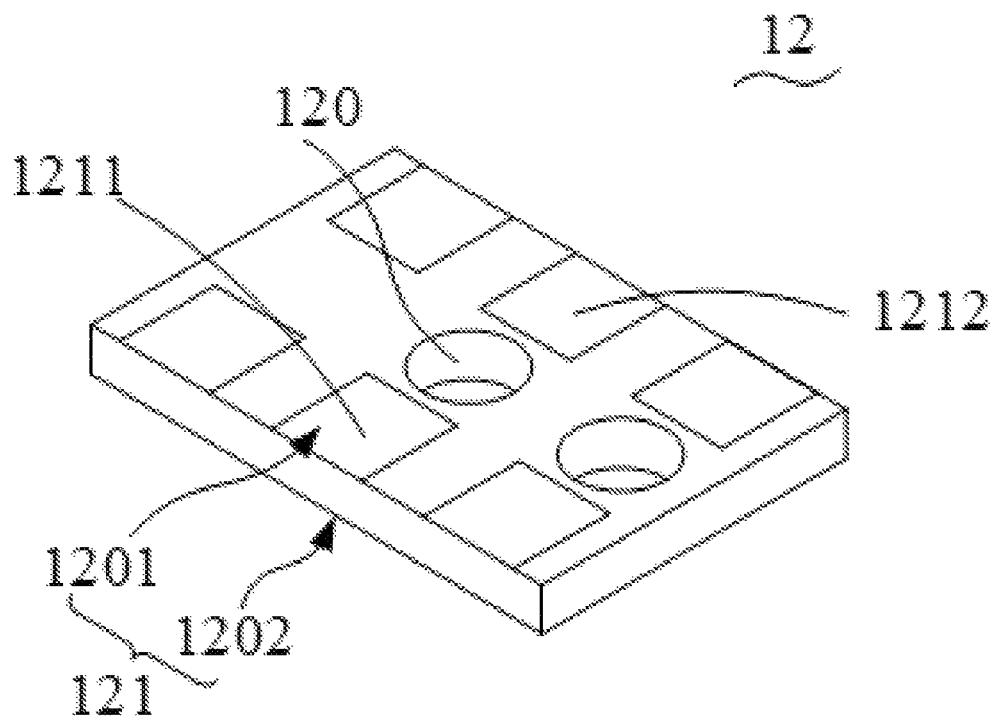
FIG. 11 is a schematic perspective view showing a supporting base provided in EMBODIMENT 2 of the application.
Figure 12:
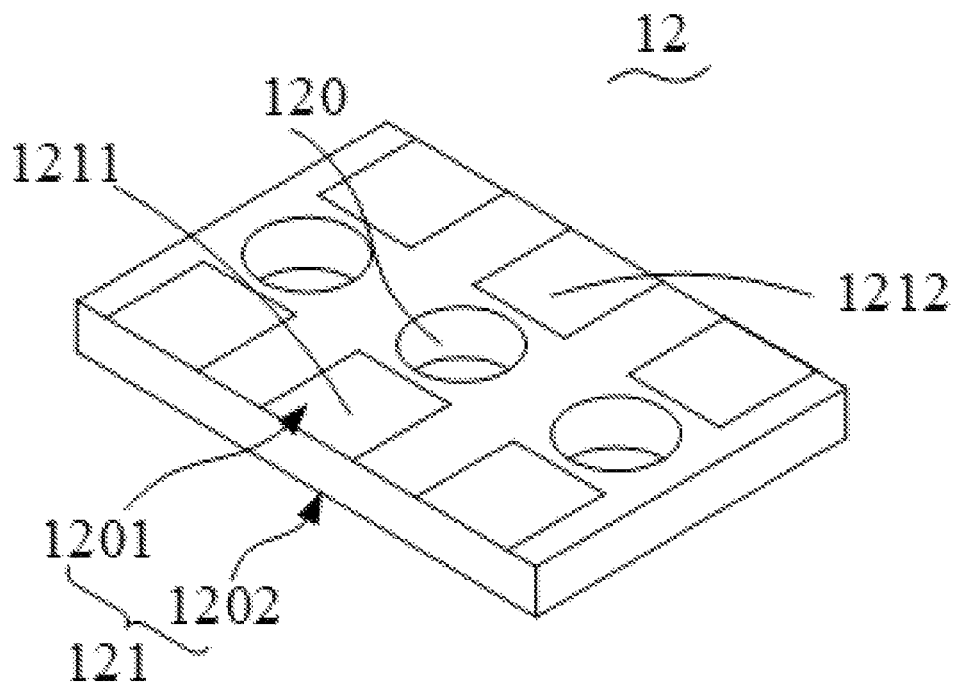
FIG. 12 is a schematic perspective view showing a supporting base provided in another way of implementation of EMBODIMENT 2 of the application.
Figure 13:
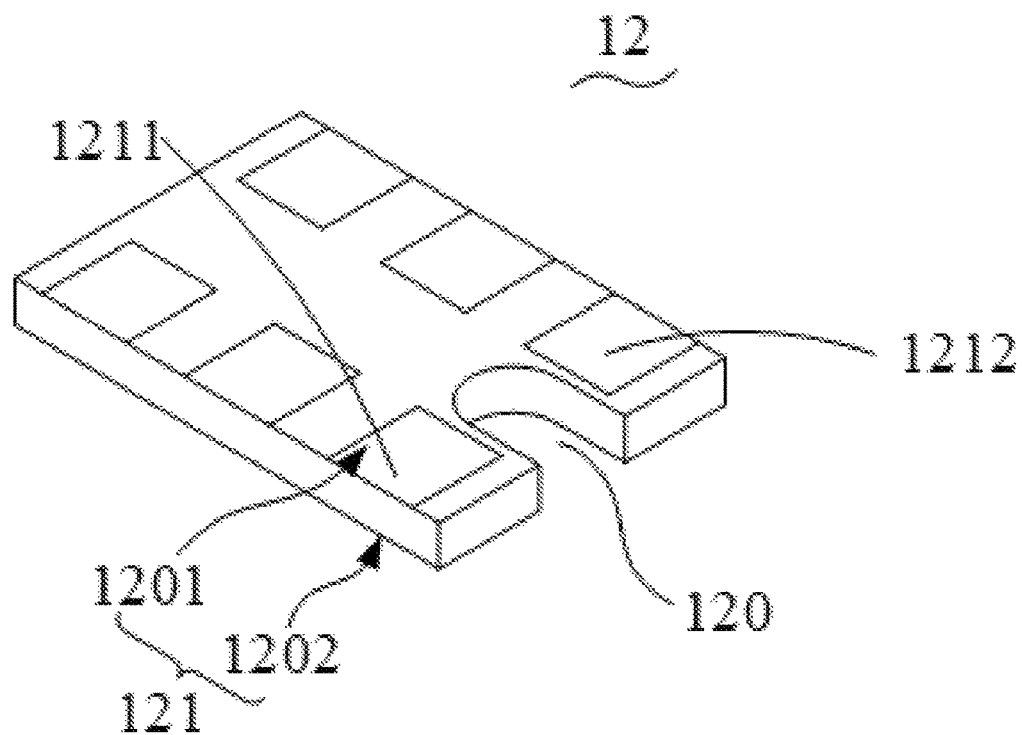
FIG. 13 is a schematic perspective view showing a supporting base provided in EMBODIMENT 3 of the application.
Figure 14:
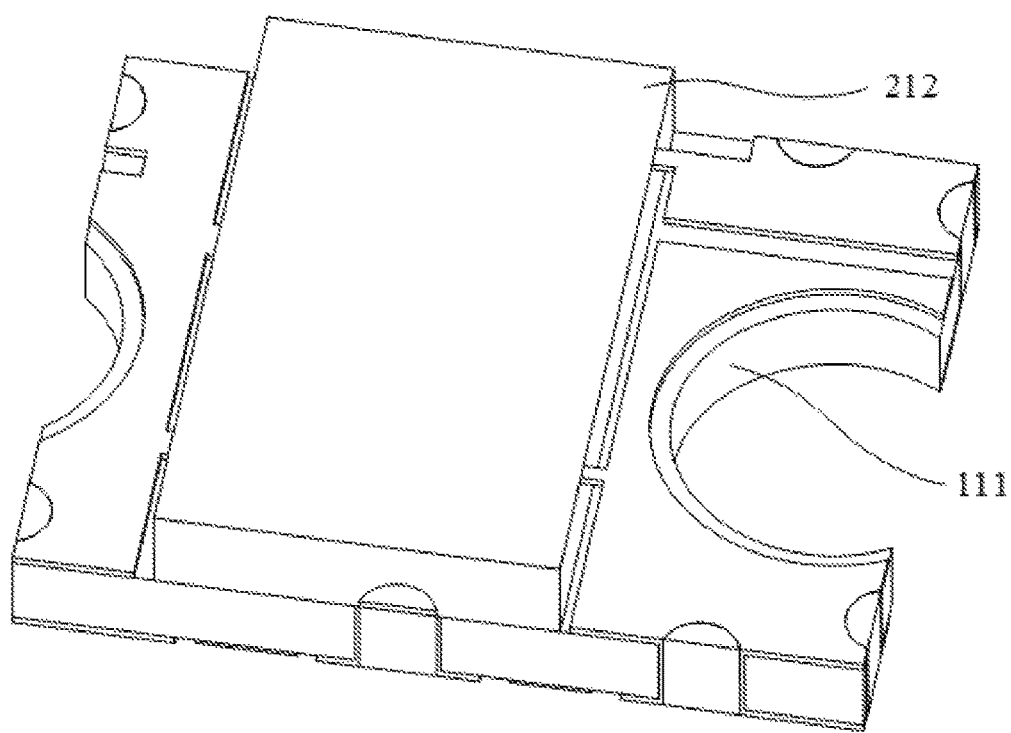
FIG. 14 is a schematic perspective view showing an LED bead provided in EMBODIMENT 4 of the application.
Figure 15:
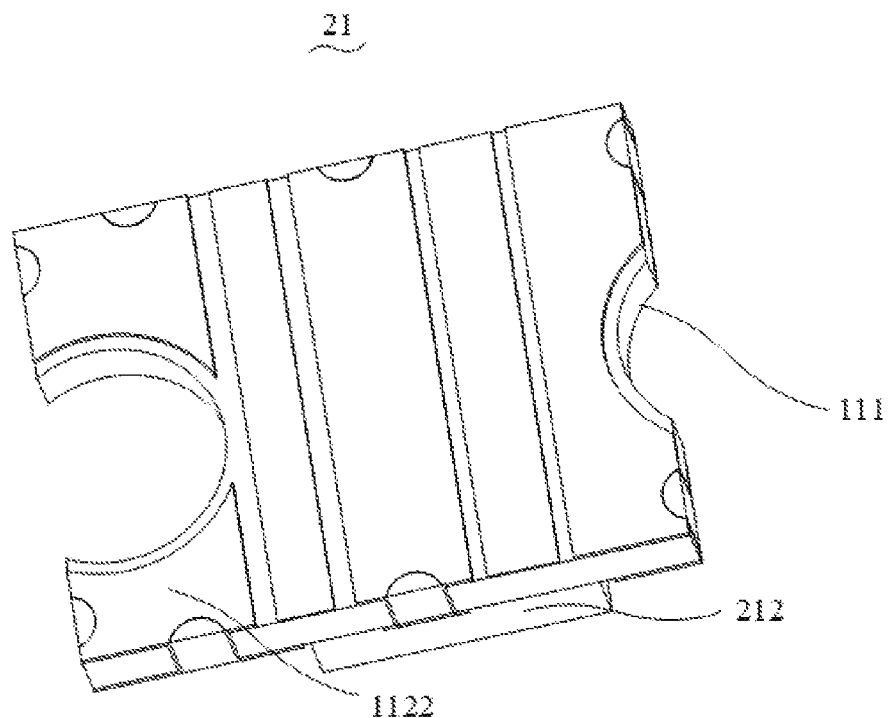
FIG. 15 is a schematic perspective view showing, from a different viewing angle, the LED bead provided in EMBODIMENT 4 of the application.
Figure 16:
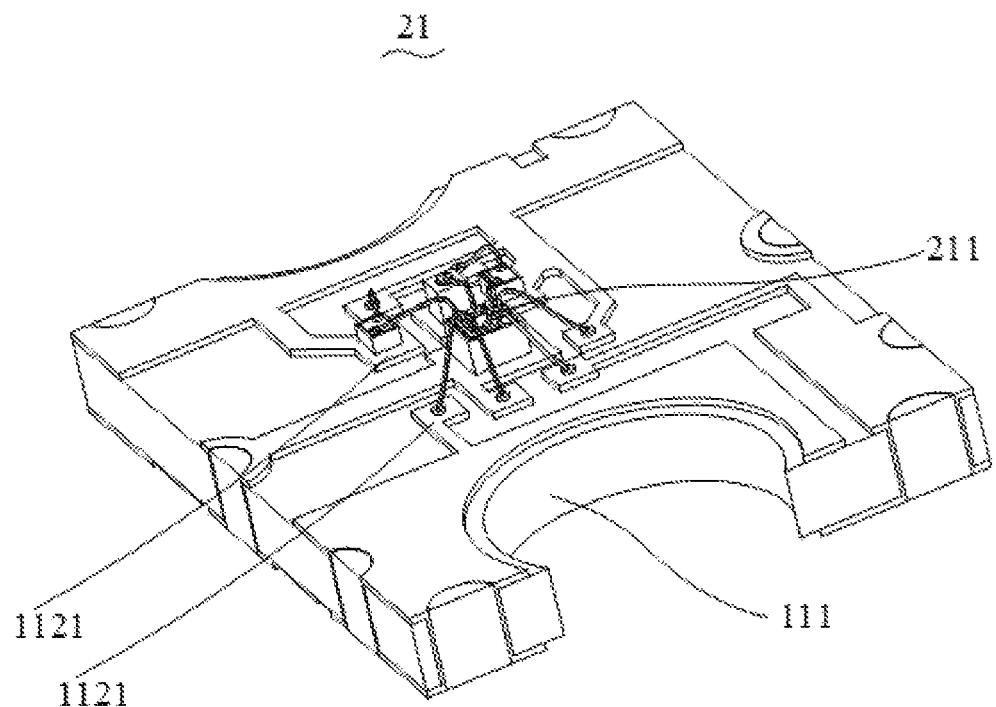
FIG. 16 is a schematic perspective view showing the LED bead provided in EMBODIMENT 4 of the application, with LED sealing resin removed.
Figure 17:
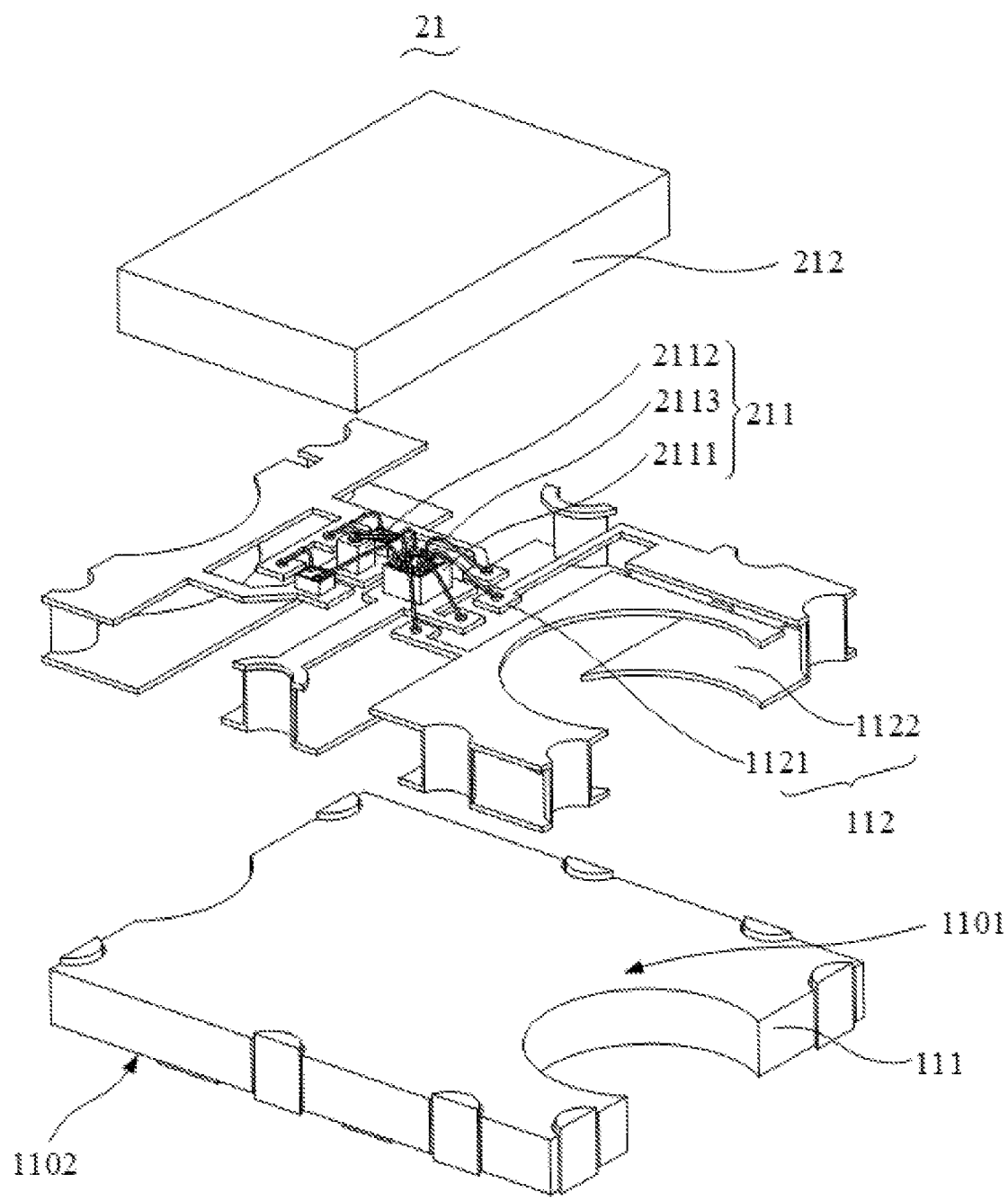
FIG. 17 is a schematic exploded view showing the LED bead provided in EMBODIMENT 4 of the application.

FIGS. 1-5 show schematic structural diagrams of an LED base module 10, an LED module 20, and an LED lighting strip 30, as well as corresponding components thereof, provided in the instant embodiment; and FIGS. 9-10 are schematic diagrams illustrating a flow of a manufacturing method for the LED lighting strip 30 provided in the instant embodiment.

Figure 1:
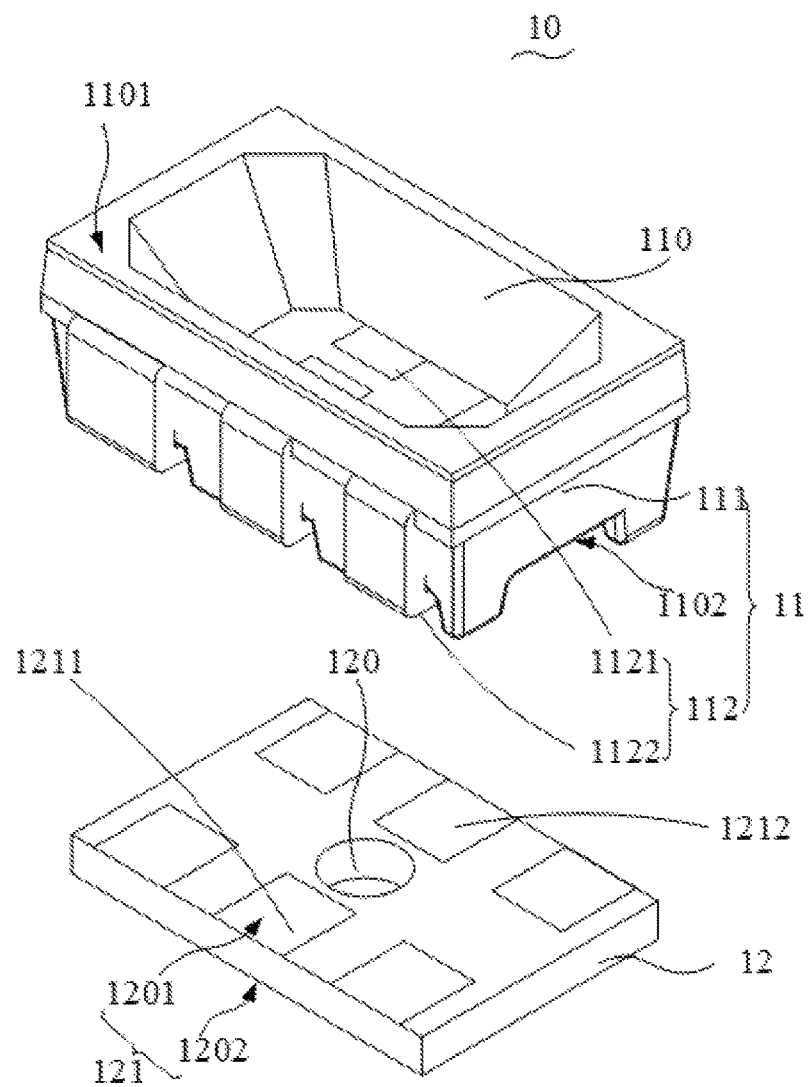
FIG. 1 is a schematic perspective view showing a light-emitting diode (LED) base module provided in EMBODIMENT 1 of the application.
Figure 3:
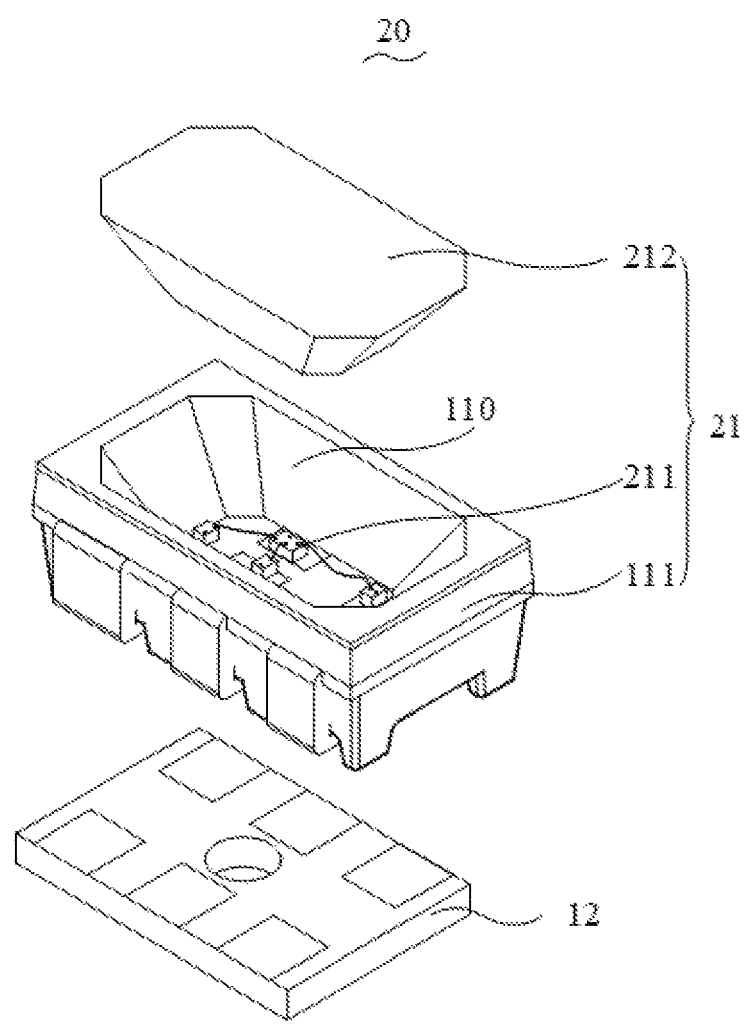
FIG. 3 is a schematic exploded view showing an LED module provided in EMBODIMENT 1 of the application.

Referring to FIGS. 1 and 3, the LED base module 10 according to the instant embodiment comprises an LED lighting base 11 and a supporting base 12 that is configured to support the LED lighting base 11. The LED lighting base 11 comprises an insulation housing 111 and multiple conductive terminals 112, and the insulation housing 111 is formed with a recessed compartment 110 for receiving an LED chip assembly 211 and an LED encapsulation resin 212 disposed therein. The multiple conductive terminals 112 are fixed in the insulation housing 111 by means of injection molding, and each of the conductive terminals 112 comprises a chip fixing portion 1121 and a pin portion 1122, and the chip fixing portion 1121 is extended into an interior of the recessed compartment 110 to electrically connect to the LED chip assembly 211, and the pin portion 1122 is exposed outside the insulation housing 111 to connect to the supporting base 12. The supporting base 12 comprises multiple conductive portions 121 and at least one avoidance through-hole 120; each of the conductive portions 121 comprises a first terminal portion 1201 and a second terminal portion 1202, and the first terminal portion 1201 and the second terminal portion 1202 are respectively arranged on two opposite surfaces of the supporting base 12, and the first terminal portion 1201 is configured to be electrically connected to the pin portion 1122 and the second terminal portion 1202 is configured to be electrically connected to a conductive line. The at least one avoidance through-hole 120 is provided for avoidance for stamp-cutting of a conductive line spanning across the avoidance through-hole 120. In the instant embodiment, the supporting base 12 is formed with the avoidance through-hole 120, and the avoidance through-hole 120 is arranged between two conductive portions 121, so that when one conductive line spanning across the avoidance through-hole 120 is soldered to the two conductive portions 121, a portion of the conductive line that corresponds to the avoidance through-hole 120 defines a spanning portion, and since the spanning portion is corresponding to the avoidance through-hole 120, stamp-cutting of the spanning portion is made easy to cut off the conductive line, and during the stamp-cutting process, a stamp-cutting apparatus 40 does not stamp on or damage the LED lighting base 11, so as to effectively protect the LED lighting base 11, and applying the LED base module 10 of the instant embodiment to manufacture the LED lighting strip 30 could achieve a pass rate up to more than 99.7%.

Figure 2:
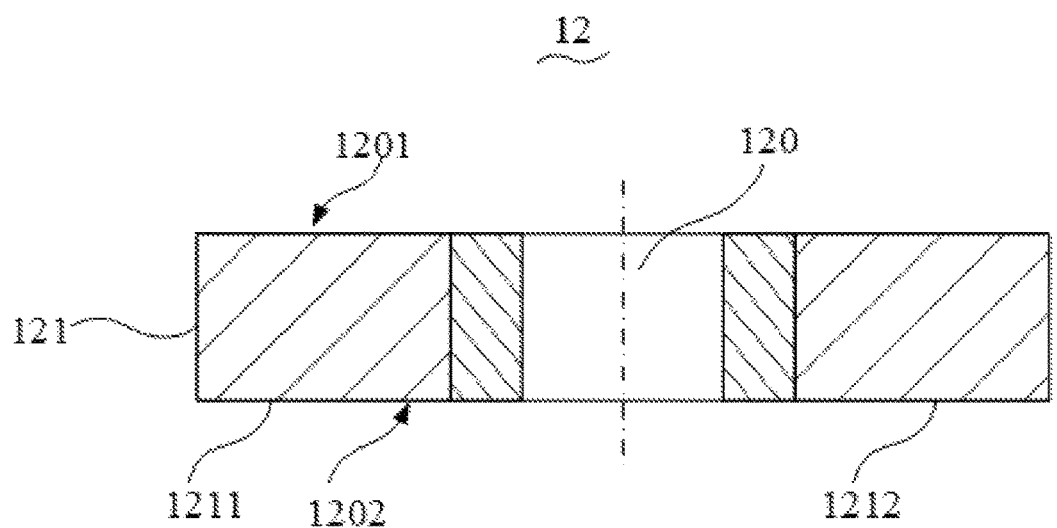
FIG. 2 is a schematic cross-sectional view showing a supporting base provided in Embodiment 1 of the application.

Referring to FIGS. 2 and 1, in some embodiments, the insulation housing 111 comprises a bottom end surface 1102 and a top end surface 1101. The recessed compartment 110 is recessed in a direction from the top end surface 1101 toward the bottom end surface 1102. The chip fixing portions 1121 extend from the insulation housing 111 into the recessed compartment 110. The pin portions 1122 are exposed outside the bottom end surface 1102. The conductive portions 121 are arranged in the supporting base 12 by extending in a direction from the bottom end surface 1102 to the top end surface 1101, and the first terminal portions 1201 formed by the conductive portions 121 face toward the bottom end surface 1102, while the second terminal portions 1202 formed by the conductive portions 121 face away from the bottom end surface 1102, which is advantageous for the first terminal portions 1201 to correspond to and electrically connect to the pin portions 1122 and being also advantageous for the second terminal portions 1202 to correspond to and electrically connect to the conductive lines, so as to effectively realize soldering of the LET) lighting base 11 and the conductive lines on the two opposite sides of the supporting base 12. The avoidance through-hole 120 is formed in the supporting base 12 by extending in a direction from the bottom end surface 1102 to the top end surface 1101, so that for the conductive lines soldered to the supporting base 12, one of the conductive lines spans over the avoidance through-hole 120 on the surface of the supporting base 12 that is opposite to the LED lighting base 11, and during stamp-cutting, a cutter is allowed to penetrate through the avoidance through-hole 120 to thus cut off the conductive line spanning over the avoidance through-hole 120.

Referring to FIGS. 1, in some embodiments, at least parts of the conductive portions 121 are grouped pairwise to form first conductive pairs, and in a same one of the first conductive pairs, one of the conductive portions 121 acts as an input terminal and another one of the conductive portions 121 acts as an output terminal; and the avoidance through-hole 120 is formed between the two conductive portions 121 of one of the first conductive pairs. In such a structural design, when one of the conductive lines is connected between the two conductive portions 121 of the first conductive pair, a portion of the conductive line spans across the avoidance through-hole 120 to form a spanning portion, and two opposite ends of the spanning portion are soldering portions, so that after the soldering portions are respectively soldered to the two conductive portions 121, stamp-cutting of the spanning portion of the conductive line can be easily conducted, and therefore, transmission between the conductive portion 121 that serves as the input terminal and the conductive portion 121 that serve as the output terminal via the conductive line that spans over the two conductive portions 121 is prevented, and must be instead transmitted from the conductive portion 121 that serves as the input terminal through one of the pin portions 1122 into the LED chip assembly 211 mounted in the recessed compartment 110, and then from the LED chip assembly 211 through another one of the pin portions 1122 to the conductive portion 121 that serve as the output terminal to be subsequently transmitted through the conductive line to a next LED chip assembly 211, thereby realizing cascade signal transmission for multiple LED modules 20. The structural design of the avoidance through-hole 120 helps improve processing reliability of the LED lighting strip 30 and prevents stamp-cutting conducted on the conductive line from damaging or breaking the LED lighting base 11, and also help effectively resolve the influence on stamp-cutting reliability. In the instant embodiment, except for the two conductive portions 121 that form the first conductive pair, remaining ones of the conductive portions 121 can be arranged in an unpaired manner, or they can be arranged in a paired fashion.

Referring to FIGS. 1 and 2, in some embodiments, the number of the first conductive pair is one, and in the first conductive pair, the conductive portion 121 that serves as the input terminal forms a first signal input terminal 1211, and the conductive portion 121 that serves as the output terminal forms a first signal output terminal 1212. Under this condition, the number of the avoidance through-hole 120 is one, and the avoidance through-hole 120 is arranged between the first signal input terminal 1211 and the first signal output terminal 1212, so that the conductive line, when extending from the first signal input terminal 1211 to the first signal output terminal 1212, spans over the avoidance through-hole 120 to thereby facilitate implementation of stamp-cutting of the conductive line for cutting off the spanning portion connected between the first signal input terminal 1211 and the first signal output terminal 1212 and therefore preventing the first signal input terminal 1211 and the first signal output terminal 1212 from directly communicating with each other through the conductive line spanning over the avoidance through-hole 120. In some embodiments, the number of the first conductive pairs is three, and the avoidance through-hole 120 is arranged between the two conductive portions 121 of one of the first conductive pairs. Of course, the number of the first conductive pairs is not limited to one or three, and there may be two or four such pairs. It can be specifically set according a practical requirement.

Referring to FIG. 1 or 2, in some embodiments, the supporting base 12 comprises one of a bismaleimide-triazine resin board (BT), a printed circuit board (PCB), a printed circuit board assembly (PCBA), and a flexible printed circuit board (FPCB). These boards, which are listed as examples for the supporting base 12, have good insulative property, on the one hand, and are easy for machining through stamping and cutting, on the other hand.

Referring to FIG. 1, in some embodiments, the LED lighting base 11 comprises a constraint protrusion (not shown in the drawings), and the constraint protrusion is formed on the surface of the LED lighting base 11 that faces the supporting base 12, meaning the constraint protrusion is extended from the bottom end surface 1102 of the LED lighting base 11 toward the supporting base 12, so that when the supporting base 12 is being mounted to the LED lighting base 11, the constraint protrusion may penetrate into the avoidance through-hole 120 to enhance positioning reliability and connection reliability between the LED lighting base 11 and the supporting base 12.

Referring to FIGS. 1, in some embodiments, an orthographic projection that the bottom end surface 1102 of the LED lighting base 11 casts on the supporting base 12 does not go beyond an area circumferentially delimited by an outer edge of the supporting base 12. For such a structural design, it is possible to mount at least one LED lighting base 11 on one supporting base 12, so that an effect of mounting multiple LED beads 21 on one single supporting base 12 is achieved. In some embodiments, the orthographic projection that the bottom end surface 1102 of the LED lighting base 11 casts on the supporting base 12 falls within the area circumferentially delimited by the outer edge of the supporting base 12, and in such a structural design, each single supporting base 12 may be mounted with multiple LED beads 21. In some embodiments, the orthographic projection that the bottom end surface 1102 of the LED lighting base 11 casts on the supporting base 12 is coincident with the area circumferentially delimited by the outer edge of the supporting base 12, and in such a structural design, it can be ensured that each single supporting base 12 can be mounted with one LED bead 21. The structural design of the supporting base 12 and the LED lighting base 11 allows the soldering between the LED lighting base 11 and the conductive lines not to be constrained by the size of the LED lighting base 11 and is instead determined by the supporting base 12, and the way of directly soldering the conductive lines to the LED lighting base 11 is changed to soldering the conductive lines to the supporting base 12, so that it is possible to effectively increase the processing efficiency of the LED lighting strip 30 and improve the pass rate for the manufacture of the LED lighting strip 30.

Figure 4:
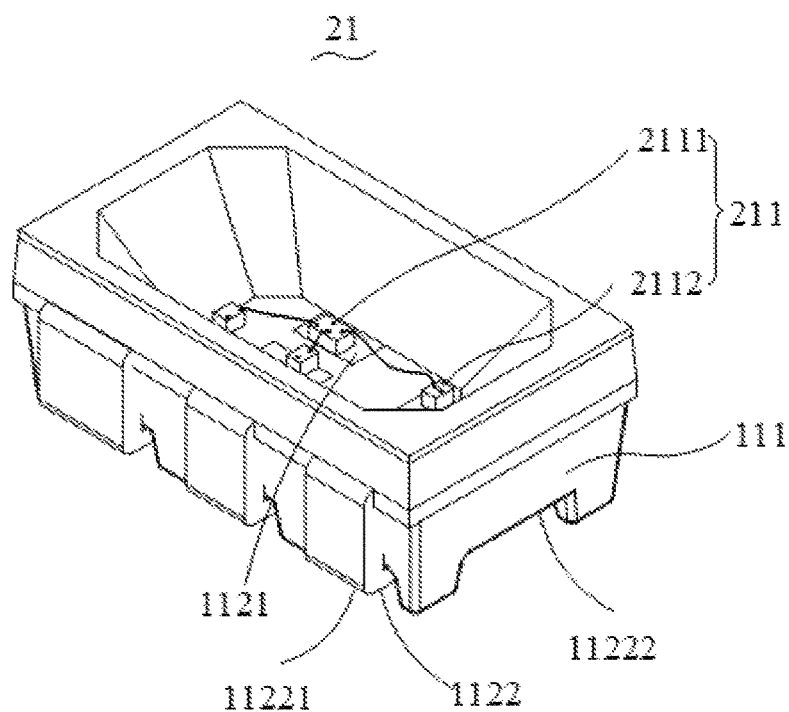
FIG. 4 is a schematic perspective view showing an LED bead provided in EMBODIMENT 1 of the application, with an LED encapsulation resin removed.

Referring to FIGS. 3 and 4, based on the above-described LED base module 10, the instant embodiment further provides an LED module 20. The LED module 20 comprises the above-described supporting base 12 and an LED bead 21, wherein one of the conductive portions 121 of the supporting base 12 serves as a first signal input terminal 1211, while another one of the conductive portions 121 serves as a first signal output terminal 1212, and one avoidance through-hole 120 is arranged between the first signal input terminal 1211 and the first signal output terminal 1212. The LED bead 21 comprises an LED chip assembly 211, LED encapsulation resin 212, and the above-described LED lighting base 11; the LED chip assembly 211 is mounted in the recessed compartment 110 and is electrically connected to the chip fixing portions 1121; the LED encapsulation resin 212 is filled in the recessed compartment 110; one of the pin portions 1122 of the LED lighting base 11 serves as a second signal input end 11221, and another one of the pin portions 1122 serves as a second signal output end 11222; the second signal input end 11221 is arranged to correspond to and connect to the first signal input terminal 1211, and the second signal output end 11222 is arranged to correspond to and connect to the first signal output terminal 1212.

Referring to FIG. 4, in some embodiments, the LED chip assembly 211 comprises a driving chip 2111 (which is an integrated circuit (IC) chip) and at least one kind of light-emitting chip 2112, wherein the driving chip 2111 is electrically connected to the light-emitting chip 2112. In some embodiments, the driving chip 2111 is mounted on one of the chip fixing portions 1121, and one of the kinds of light-emitting chip 2112 is mounted, in a corresponding manner, on one of the chip fixing portions 1121. In some embodiments, the LED chip assembly 211 further comprises connecting lines 2113, and each kind of light-emitting chip 2112 achieves electrical connection with the driving chip 2111 by means of the connecting lines 2113, and also, the driving chip 2111 achieves electrical connection with the chip fixing portions 1121 by means of the connecting lines 2113, so that a signal inputted from the first signal input terminal 1211 is transmitted into the driving chip 2111; each kind of light-emitting chip 2112 achieves electrical connection with the chip fixing portion 1121 on which such a kind of light-emitting chip 2112 is mounted by means of the connecting lines 2113. In some embodiments, the light-emitting chips 2112 include a blue-light LED chips, a green-light LED) chip, a red-light LED chip, and a white-light LED) chip, and each of the kinds of light-emitting chip 2112 is mounted on one corresponding chip fixing portion 1121; or one of the chip fixing portions 1121 receives two or more light-emitting chips 2112 mounted thereon at intervals.

Figure 5:
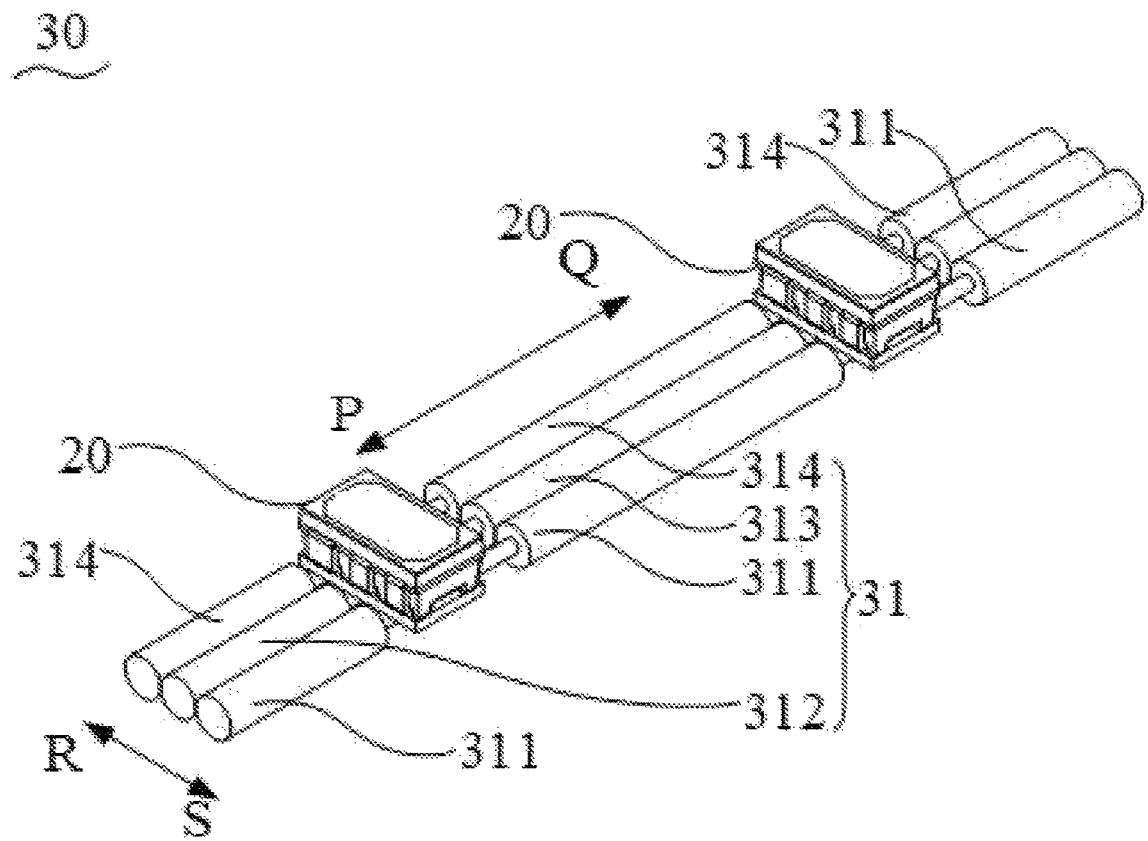
FIG. 5 is a schematic perspective view showing an LED lighting strip provided in EMBODIMENT 1 of the application.

Referring to FIGS. 5 and 3, based on the above-described LED module 20, the instant embodiment further provides an LED lighting strip 30.

Specifically, the LED lighting strip 30 comprises a conductive line assembly 31 and at least two LED modules 20. The conductive line assembly 31 at least comprises a power line 311, a signal input line 312, and at least one signal transmission line 313, and each of the supporting bases 12 is soldered with at least one LED bead 21. The power line 311 functions for connecting the LED beads 21 with an external power source, and one end of the signal input line 312 is connected to an external signal source and another end is connected to the first signal input terminal 1211 of one of the supporting bases 12 to input a signal to the LED lighting strip 30; one end of the signal transmission line 313 is connected to the first signal output terminal 1212 of one of the supporting bases 12 and another end is connected to the first signal input terminal 1211 of another one of the supporting bases 12 so as to realize cascade transmission of the signal between two adjacent LED beads 21.

Referring to FIGS. 5 and 1, in some embodiments, the power line 311 is connected to one conductive portion 121 of the remaining conductive portions 121 of each of the supporting base 12, so as to fulfill supplying electricity to the LED lighting strip 30. In some embodiments, the conductive line assembly 31 further comprises a grounding line 314, and the grounding line 314 functions to ground the LED lighting strip 30. In some embodiments, the LED lighting strip 30 further comprises insulative sealing resin (not shown in the drawings), and the insulative sealing resin encloses at least portions where the LED modules 20 and the conductive line assembly 31 are mutually connected. In some embodiments, the insulative sealing resin completely encloses exposed portions of the conductive line assembly 31 and the LED modules 20, in order to prevent electrical leaking at soldered portions between the LED beads 21 and the supporting bases 12 and also to prevent electrical leaking at soldered portions between the supporting bases 12 and the conductive line assembly 31. In some embodiments, in addition to the power line 311, the signal input line 312, the signal transmission line 313, and the grounding line 314, the conductive line assembly 31 may further comprise other lines according to a practical requirement.

Figure 6:
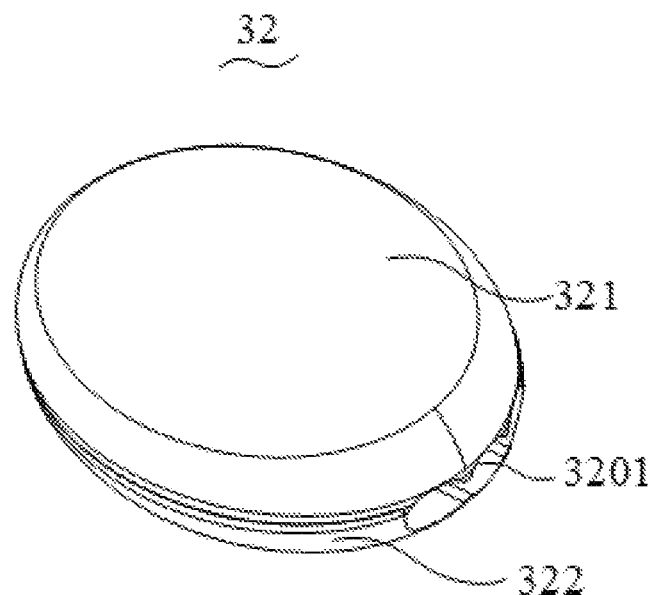
FIG. 6 is a schematic perspective view showing a light casing provided in EMBODIMENT 1 of the application.
Figure 7:
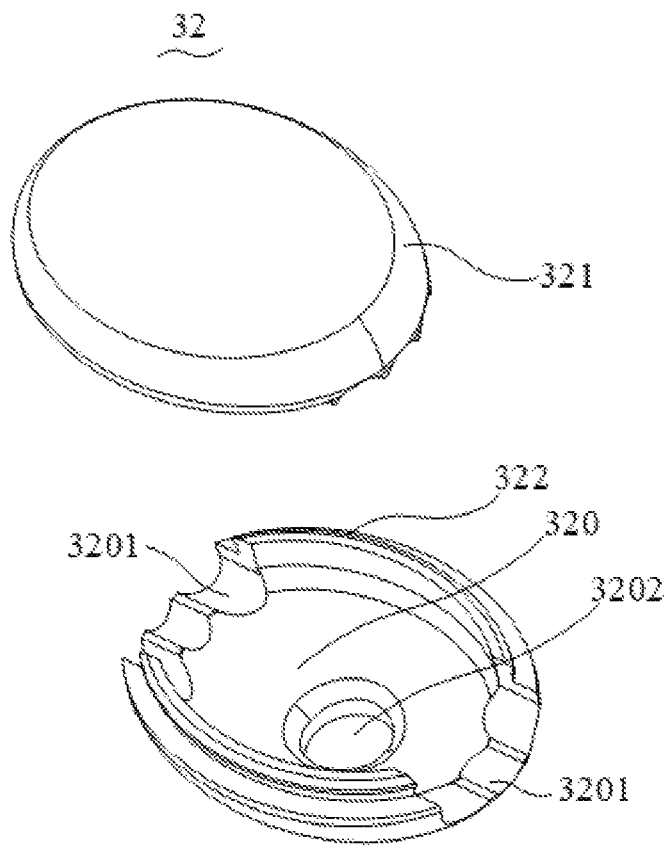
FIG. 7 is a perspective exploded view showing the light casing provided in EMBODIMENT 1 of the application.
Figure 8:
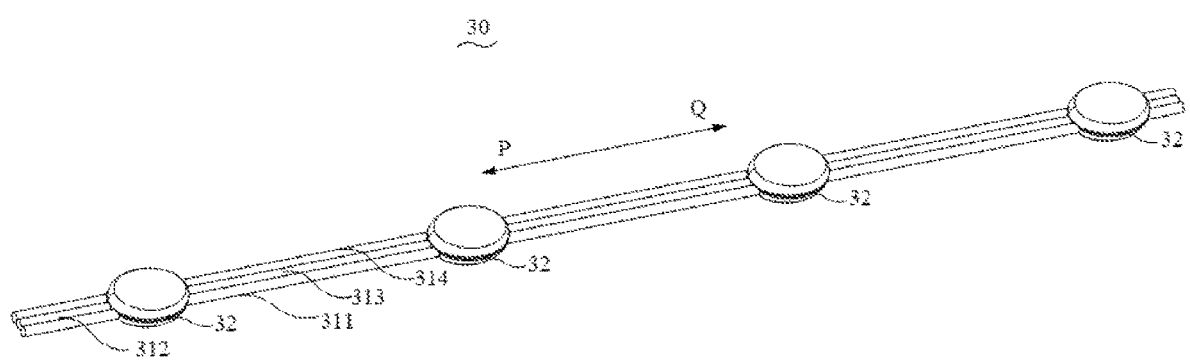
FIG. 8 is a perspective view showing the LED lighting strip provided in EMBODIMENT 1 of the application, with the light casings included thereon.

Referring to FIGS. 6, 7, and 8, in some embodiments, the LED lighting strip 30 further comprises a light casing 32, and the light casing 32 comprises a receiving chamber 320 for receiving the LED module 20 therein. Sealing resin is filled in the receiving chamber 320 to hermetically seal the LED module 20. Further, the light casing 32 exhibits a property of light transmission to allow light from the LED bead 21 to transmit therethrough. In some embodiments, one LED light casing 32 receives therein one LED module 20, or one LED light casing 32 receives therein two or more LED modules 20. In some embodiments, the light casing 32 comprises a first casing member 321 and a second casing member 322. The first casing member 321 and the second casing member 322 are snap connectable to each other to form the light casing 32, and the first casing member 321 and the second casing member 322 jointly delimit and enclose the receiving chamber 320. In some embodiments, the light casing 32 is formed with a resin injection aperture 3201 and a conductive line aperture 3202, wherein the resin injection aperture 3021 functions to receive injection of the sealing resin to seal the LED module 20, and meanwhile, the sealing resin also function to adhesively connect the first casing member 321 and the second casing member 322 for fixing together, and the conductive line aperture 3202 allows the conductive line assembly 31 that is soldered to the LED module 20 to extend therethrough outside the light casing 32.

Referring to FIGS. 9 and 10, based on the above-described LED lighting strip 30, the instant embodiment further provides a manufacturing method for the LED lighting strip 30.

Specifically, the manufacturing method for the LED lighting strip 30 comprises the following steps:

Step S01, arranging at least two conductive lines to extend along a first linear trace PQ, spacing being present between two adjacent ones of the conductive lines.

Before Step S01, in which the at least two conductive lines are arranged to extend along the first linear trace PQ, a step of processing the at least two conductive lines to strip off insulation layers thereof is further included, so that through stripping off the insulation layers of the conductive lines, each of the conductive lines is formed with a line core exposed portion 310 corresponding to the supporting base 12, and each of the line core exposed portions 310 is connected to two of the conductive portions 121 of one supporting base 12 that are arranged along the first linear trace PQ, so that when the supporting base 12 is soldered to the at least two conductive lines, each of the line core exposed portions 310 is soldered to two conductive portions 121 arranged along the first linear trace PQ, and at least one of the line core exposed portions 310 spans over the avoidance through-hole 120 located between two conductive portions 121 arranged along the first linear trace PQ to form the stamp-cutting portion. In the instant embodiment, the at least two conductive lines are arranged to extend along the first linear trace PQ to form the conductive line assembly 31.

In some embodiments, in processing the conductive lines for removal of the insulation layer, namely removal of the enamel paint layers, before the removal of the insulation layers, the conductive lines are first stretched straight to set the conductive lines in a taut state in order to help form the line core exposed portions 310 in a relatively precise way in a direction of extension along the first linear trace PQ, so that two adjacent line core exposed portions 310 of two conductive lines jointly form an exposed region to support one supporting base 12 thereon. In some embodiments, three conductive lines are set side by side as extending along the first linear trace PQ to form the conductive line assembly 31, and the three conductive lines form the line core exposed portions 310 at extension lengths thereof that are consistent to each other. In some embodiments, a wire guide rod is applied to extend the conductive lines along the first linear trace PQ, and a wire pressing board is applied to press down the conductive lines extending along the first linear trace PQ, in order to prevent the conductive lines from twisting and deforming, and also, a detector and an encoder are applied to measure the extension lengths of the conductive lines in order to determine a region for stripping of the insulation layers. In some embodiments, the number of the conductive lines is not limited to two or three, and there may be more than three of them to make up the conductive line assembly 31.

Step S02, arranging at least two supporting bases 12 at intervals along the first linear trace PQ on the at least two conductive lines.

In Step S02, the supporting bases 12 are positioned on the line core exposed portions 310 of the conductive lines. In some embodiments, before the supporting bases 12 are positioned on the line core exposed portions 310, a step of coating a solder paste on the line core exposed portions 310 of the conductive lines is further included, in order to improve soldering reliability between the supporting bases 12 and the line core exposed portions 310. In some embodiments, the solder paste can also be coated on the supporting bases 12, or other measures be adopted to improve the effect of soldering of the supporting bases 12 and the conductive lines. In some embodiments, the number of the supporting base 12 is at least two, and at least two conductive lines are formed with two exposed regions, and the two exposed regions are arranged at intervals along the first linear trace PQ, so that the supporting base 12 can be placed on each of the exposed regions. In some embodiments, the number of the supporting bases 12 is at least two, and the number of the exposed regions is equal to the number of the supporting bases 12, and each of the exposed regions correspondingly receives one of the supporting bases 12 positioned thereon.

In some embodiments, the supporting base 12 is provided with multiple first conductive pairs, and the multiple first conductive pairs are arranged at intervals along the second linear trace RS. The second linear trace RS and the first linear trace PQ are perpendicular to each other. Each of the first conductive pairs corresponds to one of the conductive lines, so that the two conductive portions 121 of each of the first conductive pairs are soldered to a corresponding one of the conductive lines.

Step S03, subjecting the supporting bases 12 and the at least two conductive lines to processing of soldering, so as to have each of the conductive lines soldered to two of the conductive portions 121 that are arranged along the first linear trace PQ, and a spanning portion of at least one of the conductive lines spanning over an avoidance through-hole 120 between two of the conductive portions 121 that are arranged along the first linear trace PQ to form a stamp-cutting portion.

In Step S03, a hot air mechanism is operated to solder, and thus fix, the supporting bases 12 and the conductive lines together, and upon completion of the soldering, one of the conductive lines spans over the avoidance through-hole 120 to form the spanning portion (not labeled in the drawings), and two opposite ends of the spanning portion are respectively soldered on the conductive portions 121 that are located on opposite sides of the avoidance through-hole 120, in order to simplify a process of stamp-cutting subsequently conducted on the one of the conductive lines.

Step S04, subjecting the spanning portion/stamp-cutting portion to processing of stamp-cutting so as to cut off, through stamping, the conductive line.

In Step S04, a stamp-cutting apparatus 40 is applied to stamp and thus cut off the spanning portion of the conductive line. To stamp and cut, the conductive lines on which the supporting bases 12 are soldered are first turned over in order to make the conductive lines face upward, while the supporting bases 12 face downward, and the supporting bases 12 are placed on a supporting member, and a cutter 41 moves from an upper side to a lower side to feed in a direction along a central axis of the avoidance through-hole 120 in order to penetrate into the avoidance through-hole 120 to stamp on and cut off the spanning portion, so that the conductive line that spans across the avoidance through-hole 120 is divided into two separate parts to end cutting, and the cutter 41 retreats out of the avoidance through-hole 120 through moving along the central axis of the avoidance through-hole 120 to complete the processing of stamp-cutting. In the entire process of stamp-cutting, the cutter 41 only acts and cuts of the spanning portion of the conductive line, but not any other segments of the conductive lines, and the cutter 41 does not contact with the supporting base 12, so as to effectively prevent the stamp-cutting apparatus 40 from causing damage or even breaking to the supporting base 12, and simultaneously, the efficient of stamp-cutting is increased. The conductive line so stamped and cut off, is the signal line, so that multiple segments of signal line are formed, and one of the signal line segments acts as the signal input line 312, while the remaining ones of the signal line segments act as the signal transmission lines 313. One end of the signal input line 312 is connected to the external signal source to input a signal into the LED bead 21 by way of the conductive portions 121 of the supporting base 12, and each segment of signal transmission lines 313 is connected between two adjacent ones of the supporting bases 12 to form a cascade connection of the signal source among the LED beads 21.

Steps S05-S06, disposing at least one LED bead 21 on a surface of each of the supporting bases 12 that faces away from the conductive lines.

In Step S05, the conductive lines on which the supporting bases 12 are soldered are first turned over in order to allow the surface of the supporting bases 12 facing away from the conductive lines to face upward, in order to allow the LED beads 21 to be easily disposed on the supporting bases 12. In some embodiments, before the LED beads 21 are disposed on the supporting bases 12, a step of coating a solder paste on the supporting bases 12 is further included, in order to facilitate soldering conducted on the LED beads 21 and the supporting bases 12 and enhance solder reliability and solder firmness. In some embodiments, solder paste can also be applied to the conductive portions 121 of the LED beads 21. During the disposition of the LED beads 21, pins of the LED beads 21 must be each set to correspond to one of the conductive portions 121.

In some embodiments, the LED lighting base 11 comprises a constraint protrusion (not shown in the drawings), and the constraint protrusion is formed on the surface of the LED lighting base 11 that faces the supporting base 12 and corresponds to the avoidance through-hole 120. In mounting the LED bead 21 on the supporting base 12, the constraint protrusion penetrates into the avoidance through-hole 120. With the constraint protrusion penetrating into the avoidance through-hole 120, reliability of connection of the LED bead 21 and the supporting base 12 is enhanced.

Step S07, subjecting pin portions 1122 and the conductive portions 121 to processing of soldering.

In Step S07, a hot air mechanism is applied to conduct soldering between the LED beads 21 and the supporting bases 12, so as to fix the LED beads 21 to the supporting bases 12. To solder, it is preferable to ensure that an orthographic projection that the bottom end surface 1102 of the LED lighting base 11 casts on the supporting base 12 does not exceed an area circumferentially delimited by an outer edge of the supporting base 12. In some embodiments, the orthographic projection that the bottom end surface 1102 of the LED lighting base 11 casts on the supporting base 12 falls within the area circumferentially delimited by the outer edge of the supporting base 12. In some embodiments, the orthographic projection that the bottom end surface 1102 of the LED lighting base 11 casts on the supporting base 12 is coincident with the area circumferentially delimited by the outer edge of the supporting base 12, so as ensure that each single supporting base 12 can be mounted with one LED bead 21.

After Step S07, implementing processing of insulative sealing on soldering portions between the conductive lines and the supporting bases 12 and soldering portions between the supporting bases 12 and the LED beads 21 is further included, so that by means of the processing of insulative sealing, insulative sealing is realized on the soldering portions between the LED beads 21 and the supporting bases 12 and the soldering portions between the supporting bases 12 and at least two conductive lines to thereby enhance the reliability of the LED lighting strip 30. In some embodiments, sealing resin is attached to the soldering portions between the supporting bases 12 and the conductive lines and the soldering portions between the supporting bases 12 and the LED beads 21, followed by ultraviolet (UV) curing and sealing. In some embodiments, curing and sealing is achieved by using epoxy resin.

In some alternative embodiments, after Step S07, placing the supporting base 12 and the LED bead 21 soldered on the supporting base 12 into a light casing 32, and then subjecting the supporting base 12 and the LED bead 21 to processing of sealing are further included. Specifically, a first casing member 321 is set on and covers an end of the LED bead 21 facing away from the supporting base 12, and a second casing member 322 is set on and covers an end of the supporting base 12 facing away from the LED bead 21, and the first casing member 321 and the second casing member 322 are mutually combined to form a receiving chamber 320 in which the LED bead 21 and the supporting base 12 are received, and the conductive line assembly 31 soldered to the supporting base 12 extends outside the light casing 32 through a conductive line aperture 3202, and subsequently, sealing resin is injected through a resin injection aperture 3201 into the receiving chamber 320, followed by UV curing or epoxy, and through the curing, the first casing member 321 and the second casing member 322 are also fixed together by the sealing resin. In some embodiments, one light casing 32 receives therein one supporting base 12 and the LED bead 21 soldered to the supporting base 12. In some embodiments, one light casing 32 receives therein two or more supporting bases 12 and the LED beads 21 soldered to the supporting bases 12.

The manufacturing method for the LED lighting strip 30 provided in the instant embodiment is applied to manufacture five models of the LED lighting strip 30, and tests are applied to each model of the LED lighting strip 30. During the tests, alternate voltage is applied, according to what listed in TABLE 1, to each of the LED lighting strips 30, and the number of unlit LED beads 21 contained in each of the LED lighting strip 30 is counted, of which a result is included in TABLE 1.

TABLE 1

| model of LED lighting strip | quantity of lighting strips | quantity of LED beads (per meter) | voltage applied (V) | quantity of unlit LED beads | pass rate (%) |
| --- | --- | --- | --- | --- | --- |
| SK6805SIDE-A-001 | 2200 | 68 | 5 | 263 | 99.82 |
| SK6808RATE-001 | 5018 | 48 | 5 | 62 | 99.97 |
| SK6812SIDT-T-001 | 2650 | 62 | 5 | 453 | 99.72 |
| SK6812MINI-EB-000 | 6580 | 48 | 5 | 34 | 99.99 |
| SK6805MIN-FA-000 | 3600 | 60 | 5 | 48 | 99.99 |

It is noted from TABLE 1 that the LED lighting strips of the five models that are manufactured with the manufacturing method for the LED lighting strip 30 provided in the instant embodiment all demonstrate a pass rate higher than 99.7%. This illustrates that the manufacturing method according to the application provides a relatively high pass rate.

Embodiment 2

Referring to FIGS. 11, 12, and 1-10, an LED base module 10, an LED module 20, and an LED lighting strip 30, and a manufacturing method for the LED lighting strip 30 provided in the instant embodiment are different from EMBODIMENT 1 mainly in respect of the structural differences described below:

For EMBODIMENT 1, a supporting base 12 is formed with an avoidance through-hole 120, and the avoidance through-hole 120 is arranged between the two conductive portions 121 of one first conductive pair. Instead, in the instant embodiment, the number of the avoidance through-holes 120 is two, and the number of the first conductive pair is one, and one of the avoidance through-holes 120 is arranged between the first signal input terminal 1211 and the first signal output terminal 1212, while another one of the avoidance through-holes 120 is provided for fixing the LED lighting base 11 to thereby fix the LED bead 21. In some embodiments, the number of the first conductive pairs is two, and each pair of the first conductive pairs has one avoidance through-hole 120 corresponding thereto and arranged between the two conductive portions 121 thereof. In some embodiments, the number of the first conductive pairs is three, and the two avoidance through-holes 120 are each arranged between the two conductive portions 121 of one pair of the first conductive pairs. In some embodiments, the number of the avoidance through-holes 120 is three, and each of the avoidance through-holes 120 is correspondingly arranged between the two conductive portions 121 of one pair of the first conductive pairs. Of course, the number of the first conductive pairs and the number of the avoidance through-holes 120 can be other numbers.

Except the structural arrangement solution described above being different from EMBODIMENT 1, the LED base module 10, the LED module 20, and the LED lighting strip 30, as well as corresponding components, and the manufacturing method for the LED lighting strip 30 provided according to the instant EMBODIMENT 2 can all refer to the corresponding designs of EMBODIMENT 1, and to save page space, redundant description will be omitted herein.

Embodiment 3

Referring to FIGS. 13 and 1-10, an LED base module 10, an LED module 20, and an LED lighting strip 30, and a manufacturing method for the LED lighting strip 30 provided in the instant embodiment are different from EMBODIMENT 1 mainly in respect of the structural differences described below:

For EMBODIMENT 1, the supporting base 12 is formed with an avoidance through-hole 120, and the avoidance through-hole 120 is arranged between the two conductive portions 121 of one first conductive pair, and the avoidance through-hole 120 is arranged at a central location of the supporting base 12. Instead, in the instant embodiment, in some way of embodying, the avoidance through-hole 120 is arranged adjacent to an edge of the supporting base 12, and the avoidance through-hole 120 forms a notch having an opening facing toward a circumferential wall of the supporting base 12, and the notch is extended from the first terminal portion 1201 toward the second terminal portion 1202, so that the stamp-cutting apparatus 40 may feed in a direction of a center axis of the avoidance through-hole 120 to conduct stamp-cutting, and can also feed along the second linear trace RS to conduct stamp-cutting.

Except the structural arrangement solution described above being different from EMBODIMENT 1, the LED base module 10, the LED module 20, and the LED lighting strip 30, as well as corresponding components, and the manufacturing method for the LED lighting strip 30 provided according to the instant EMBODIMENT 3 can all refer to the corresponding designs of Embodiment 1, and to save page space, redundant description will be omitted herein.

Embodiment 4

Referring to FIGS. 14-17 and 1-10, an LED base module 10, an LET) module 20, and an LED lighting strip 30, and a manufacturing method for the LED lighting strip 30 provided in the instant embodiment are different from any one of EMBODIMENTS 1-3 mainly in respect of the structural differences described below:

For any one of EMBODIMENTS 1-3, an insulation housing 111 is formed with a recessed compartment 110 for receiving an LED chip assembly 211 and an LED encapsulation resin 212; multiple conductive terminals 112 are fixed in the insulation housing 111 by means of injection molding, and each of the conductive terminals 112 comprises a chip fixing portion 1121 and a pin portion 1122, and the chip fixing portion 1121 extends into the recessed compartment 110 to electrically connect to the LED chip assembly 211, and the pin portion 1122 is exposed outside the insulation housing 111 to connect to a supporting base 12. The supporting base 12 comprises multiple conductive portions 121 and at least one avoidance through-hole 120. Instead, in the instant embodiment, the insulation housing 111 is not formed with the recessed compartment 110, and the insulation housing 111 and the multiple conductive terminals 112 are fixed and molded by means of compression-molding, namely through a compression-molding process, an insulative material is filled into a three-dimensional space formed by the multiple conductive terminals 112 to form an insulation housing 111, with each of the conductive terminals 112 fixed in the insulation housing 111, and the chip fixing portion 1121 and the pin portion 1122 of each of the conductive terminals 112 are both exposed outside the insulation housing 111, so that the chip fixing portion 1121 is partly embedded in a top end surface 1101 of the insulation housing 111 and the pin portion 1122 is partly embedded in a bottom end surface 1102 of the insulation housing 111, and the LED chip assembly 211 is mounted to the chip fixing portion 1121, and finally, the LED encapsulation resin 212 is applied, through molding, to the top end surface 1101 of the insulation housing 111 to cover the LED chip assembly 211. In such a structural design, the LED lighting strip 30 is allowed to emit out light in multiple surfaces, namely from a front surface of the LED bead 21 and also to emit through a lateral surface of the LED bead 21, so that the LED lighting strip 30 may have an enhanced effect of illumination.

Except the structural arrangement solution described above being different from EMBODIMENT 1, EMBODIMENT 2, and EMBODIMENT 3, the LED base module 10, the LED module 20, and the LIE) lighting strip 30, as well as corresponding components, and the manufacturing method for the LED lighting strip 30 provided according to the instant Embodiment 4 can all refer to the corresponding designs of any one of EMBODIMENTS 1-3, and to save page space, redundant description will be omitted herein.

The above provides only specific ways of implementation for the application; however, the scope of protection that the application pursues is not limited thereto. Those having ordinary skill in the field of the art may contemplate various equivalent modifications or substitutes within the technical scope of the disclosure, and such modifications and substitutes should be considered failing with the scope of protection of the application. Thus, the scope of protection of the application is determined only by the scope of the claims.

What is claimed is:
1. A light-emitting diode (LED) base module, comprising:
an LED lighting base, the LED lighting base comprising an insulation housing and multiple conductive terminals, each of the conductive terminals being fixed in the insulation housing, each of the conductive terminals comprising a chip fixing portion configured to be electrically connected to an LED chip assembly and a pin portion exposed outside the insulation housing; and a supporting base, which supports and carries the LED lighting base, wherein the supporting base comprises multiple conductive portions and at least one avoidance through-hole; each of the conductive portions comprises a first terminal portion and a second terminal portion, the first terminal portions and the second terminal portions being respectively exposed at two opposite surfaces of the supporting base, the first terminal portions being configured to be electrically connected to the pin portions respectively, the second terminal portions being configured to be electrically connected to conductive lines, the at least one avoidance through-hole being configured to receive one of the conductive lines to span thereover in order to achieve avoidance for stamp-cutting.

2. The LED base module according to claim 1, wherein the insulation housing comprises a bottom end surface and a top end surface, and the pin portions are exposed outside the bottom end surface;

the conductive portions are arranged on the supporting base as being extended in a direction from the bottom end surface toward the top end surface, the first terminal portions face toward the bottom end surface, and the second terminal portions faces away from the bottom end surface; and the avoidance through-hole is formed in the supporting base in a direction from the bottom end surface toward the top end surface.

3. The LED base module according to claim 1, wherein at least parts of the conductive portions are grouped pairwise to form first conductive pair, one of the conductive portions of the first conductive pair acts as an input terminal, another one of the conductive portions acts as an output terminal, and the avoidance through-hole is formed between the two conductive portions of one pair of the first conductive pair.

4. The LED base module according to claim 3, wherein the number of the first conductive pair is one, and the input terminal of the first conductive pair acts as a first signal input terminal and the output terminal acts as a first signal output terminal; and the number of the avoidance through-hole is one, and the avoidance through-hole is arranged between the first signal input terminal and the first signal output terminal.

5. The LED base module according to claim 3, wherein the number of the first conductive pair is one, the input terminal of the first conductive pair acts as a first signal input terminal, and the output terminal acts as a first signal output terminal; and the number of the avoidance through-holes is two or more, and one of the avoidance through-holes is arranged between the first signal input terminal and the first signal output terminal.

6. The LED base module according to claim 3, wherein the number of the first conductive pairs is two or more, the input terminal of one pair of the first conductive pairs acts as a first signal input terminal, and the output terminal acts as a first signal output terminal; and the number of the avoidance through-holes is two or more, and each of the avoidance through-holes is correspondingly formed between the two conductive portions of one pair of the first conductive pairs.

7. The LED base module according to claim 1, wherein an orthographic projection that the bottom end surface of the LED lighting base casts on the supporting base does not exceed an area circumferentially delimited by an outer edge of the supporting base.

8. The LED base module according to claim 7, wherein the orthographic projection that the bottom end surface of the LED lighting base casts on the supporting base falls within the area circumferentially delimited by the outer edge of the supporting base; or the orthographic projection that the bottom end surface of the LED lighting base casts on the supporting base coincides the area circumferentially delimited by the outer edge of the supporting base.

9. The LED base module according to claim 1, wherein the conductive terminals are fixed in the insulation housing by means of injection molding, the insulation housing comprising a bottom end surface and a top end surface, the insulation housing comprising a recessed compartment, the recessed compartment being recessed in direction from the top end surface toward the bottom end surface to receive an LED chip assembly and an LED encapsulation resin therein; all of the chip fixing portions extend from the insulation housing into an interior of the recessed compartment.

10. The LED base module according to claim 1, wherein the conductive terminals are fixed in the insulation housing by means of compression molding, the insulation housing comprising a bottom end surface and a top end surface, the chip fixing portion being exposed outside the top end surface, the pin portion being exposed outside the bottom end surface, the top end surface being applicable to compression-molded encapsulation with the LED encapsulation resin.

11. A light-emitting diode (LED) module, comprising:
the supporting base according to claim 1, one of the conductive portions of the supporting base acting as a first signal input terminal, and another one of the conductive portions acting as a first signal output terminal, one avoidance through-hole being arranged between the first signal input terminal and the first signal output terminal; and an LED bead, the LED bead comprising an LED chip assembly, an LED encapsulation resin, and the LED lighting base according to claim 1;

wherein the LED chip assembly is electrically connected to the chip fixing portions;

the LED encapsulation resin encapsulates the LED chip assembly and the chip fixing portions; and one of the pin portions acts as a second signal input end, another one of the pin portions acts as a second signal output end; the second signal input end corresponding to and connected to the first signal input terminal, the second signal output end corresponding to and connected to the first signal output terminal.

12. The LED module according to claim 11, wherein the LED chip assembly comprises a driving chip and at least one kind of light-emitting chip electrically connected to the driving chip.

13. A light-emitting diode (LED) lighting strip, comprising:
at least two LED modules according to claim 11; each of the LED beads corresponding to and soldered to one of the supporting bases;

a conductive line assembly, the conductive line assembly at least comprising a power line, a signal input line, and at least one signal transmission line;

wherein one end of the signal input line is connected to an external signal source and an opposite end is connected to the first signal input terminal of one of the supporting bases in order to input a signal into the LED lighting strip; one end of the signal transmission line is connected to the first signal output terminal of the one of the supporting bases and an opposite end is connected to the first signal input terminal of an adjacent one of the supporting bases so as to realize cascade transmission of the signal between the two adjacent LED beads; and the power line electrically connecting the LED beads to an external power source.

14. The LED lighting strip according to claim 13, wherein the power line is connected to a remaining one of the conductive portions of the supporting bases, in order to supply electricity to the LED lighting strip.

15. The LED lighting strip according to claim 13, wherein the LED lighting strip further comprises an insulative sealing resin which at least encloses connecting portions where the LED modules and the conductive line assembly are connected to each other.

16. The LED lighting strip according to claim 13, wherein the LED lighting strip further comprises a light casing corresponding to and matching the LED modules, and the light casing comprises a receiving chamber, each of the LED modules being received in the receiving chamber, the conductive line assembly extending out of the light casing from the receiving chamber.

* * * * *